United States Patent [19]

Iwabuchi et al.

[11] Patent Number: 5,697,749
[45] Date of Patent: Dec. 16, 1997

[54] WAFER PROCESSING APPARATUS

[75] Inventors: Katsuhiko Iwabuchi, Sagamihara; Eiichirou Takanabe, Kanagawa-Ken, both of Japan

[73] Assignees: Tokyo Electron Kabushiki Kaisha, Tokyo-to; Tokyo Electron Tohoku Kabushiki Kaisha, Iwate-ken, both of Japan

[21] Appl. No.: 420,610

[22] Filed: Apr. 11, 1995

Related U.S. Application Data

[63] Continuation of Ser. No. 91,161, Jul. 13, 1993, abandoned.

[30] Foreign Application Priority Data

| Jul. 17, 1992 | [JP] | Japan | 4-212276 |
| Aug. 5, 1992 | [JP] | Japan | 4-227840 |
| Aug. 5, 1992 | [JP] | Japan | 4-227841 |

[51] Int. Cl.$^6$ .................................................. H01L 21/68
[52] U.S. Cl. .................. 414/217; 414/416; 414/937; 414/939; 118/719; 432/239
[58] Field of Search ................ 414/217, 222, 414/416, 935, 936, 937, 939, 940, 941, 744.3; 204/298.25; 118/500, 719; 104/35, 49; 432/239

[56] References Cited

U.S. PATENT DOCUMENTS

| 4,664,578 | 5/1987 | Kakehi | 414/940 X |
| 4,776,744 | 10/1988 | Stonestreet et al. | 414/940 X |
| 4,781,511 | 11/1988 | Harada et al. | 414/940 X |
| 4,785,962 | 11/1988 | Toshima . | |
| 4,867,629 | 9/1989 | Iwasawa et al. | 414/940 X |
| 4,990,047 | 2/1991 | Wagner et al. | 414/939 X |
| 5,048,164 | 9/1991 | Harima | 414/404 X |
| 5,162,047 | 11/1992 | Wada et al. | 414/404 X |
| 5,273,423 | 12/1993 | Shiraiwa | 414/940 X |
| 5,277,579 | 1/1994 | Takanabe | 414/217 X |

FOREIGN PATENT DOCUMENTS

| 198926 | 8/1990 | Japan | 414/937 |
| 271643 | 11/1990 | Japan | 414/937 |
| 56338 | 2/1992 | Japan | 414/937 |
| 157752 | 5/1992 | Japan | 414/940 |
| 157755 | 5/1995 | Japan | 414/937 |
| 90/10949 | 9/1990 | WIPO . | |

*Primary Examiner*—Frank E. Werner
*Attorney, Agent, or Firm*—Beveridge, DeGrandi, Weilacher & Young,LLP

[57] ABSTRACT

The present invention refers to a wafer transfer robot for a wafer boat of a wafer processing apparatus wherein a turntable within a chamber of a turntable apparatus is provided with a prescribed number of stations formed thereon. Each of the stations is provided with protrusions that hold a wafer cassette that is transferred thereto and orientated thereon in such a manner that a base surface thereof is inclined at an angle to the outward direction. Although, while the wafer cassette is being transferred and orientated, it is transferred and orientated reliably with the base surface thereof held horizontal by an elevator apparatus. By providing a loadlock chamber of a rotational configuration, the apparatus of the present invention ensures good sealing, and also ensures that when regions within the apparatus are being evacuated or being filled with an inert gas, they are kept reliably airtight. The generation of particles due to linear frictional movement is thus prevented, and the wafer processing can be performed extremely reliably and efficiently.

3 Claims, 6 Drawing Sheets

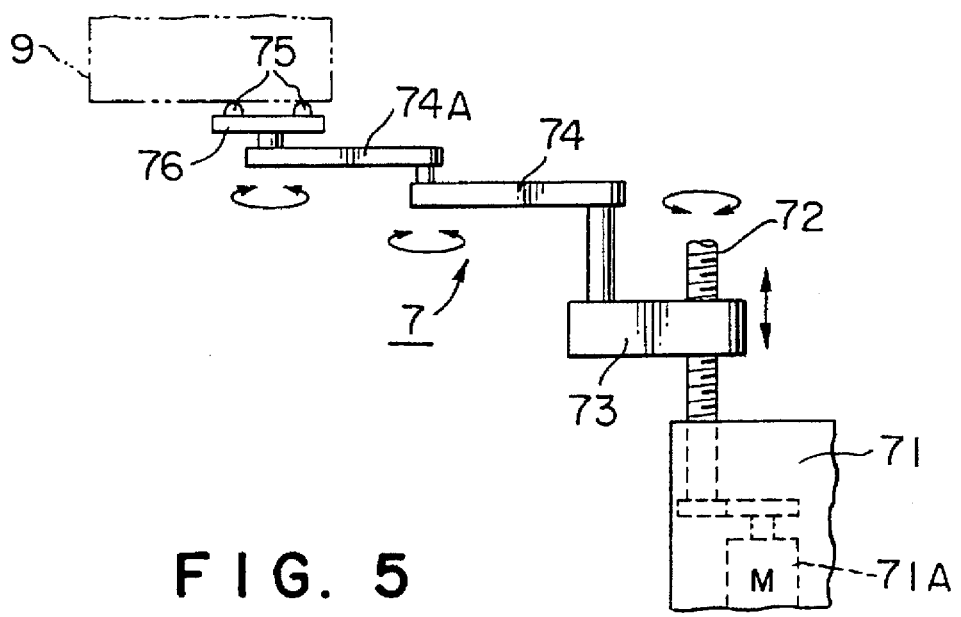
F I G. 5
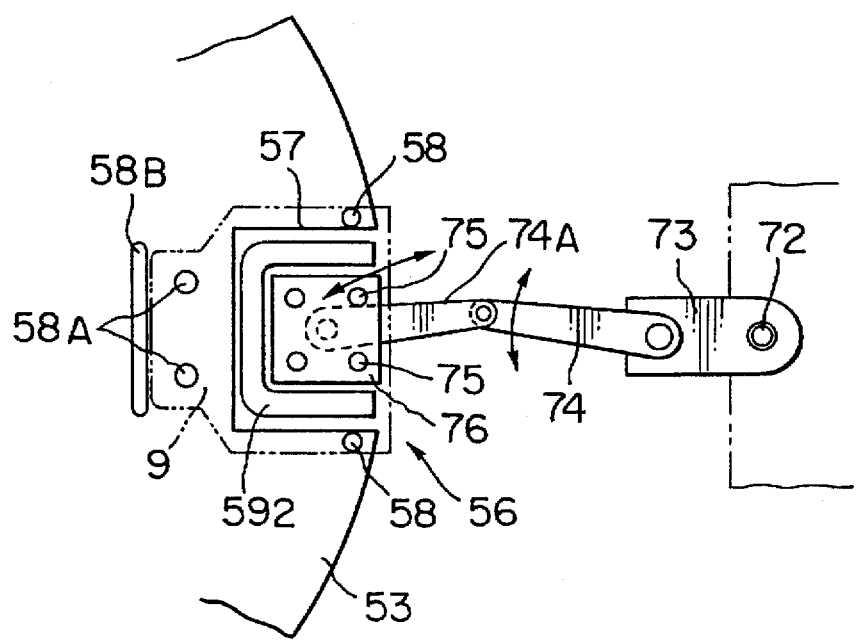
F I G. 6

WAFER PROCESSING APPARATUS

This application is a continuation of application Ser. No. 08/091,161, filed Jul. 13, 1993, now abandoned, which application is entirely incorporated herein by reference.

BACKGROUND OF THE INVENTION

The present invention relates to a wafer processing apparatus that performs a thermal treatment such as CVD, diffusion, or oxidation on semiconductor wafers.

Information processing and system devices provided with various electronic functions have recently become even more sophisticated, and the semiconductor integrated circuit devices used in such electronic processing apparatuses have become even more densely integrated. There is increasing demand for the mass-production of such devices, and there is particular interest in the mass production of DRAM chips of capacities of between 4 megabytes and 16 megabytes. It is not enough to simply improve the mass-productivity of wafers used in the production of semiconductor devices, such as silicon wafers—there are now rigid demands concerning the degree of miniaturization of such devices.

Up until the present, horizontal reaction chambers have been used as the heat treatment devices for such CVD, diffusion, or oxidation processes. However, the temperature difference between the inside and the outside of the quartz reaction tube used in such a reaction chamber (furnace) can result in air remaining in the tube during the treatment, which can cause the formation of films of natural oxides on the wafers. Therefore, manufacturers are worried that this effect could occur during the fabrication. That is why it is becoming more and more common to replace the horizontal reaction chamber with a vertical one in which the reaction tube is vertical.

A wafer processing apparatus has been realized for such a vertical processing reaction chamber, as described in, for example, the related Japanese Patent Laid-Open Publication No. 55840/1991 by the present inventors. As is well known in the art, a wafer processing apparatus of this kind is provided with components such as a wafer transfer apparatus and a robot means to load and unload wafers one at a time into and out of a boat used to insert wafers into the heat treatment reaction chamber and remove them therefrom. These components are connected by a mechanism that aligns the orientation flats of the wafers with respect to the wafer boat and also a buffer station in a cassette chamber that holds the wafers.

Therefore, techniques have been developed to introduce the cassettes from the cassette chamber via a buffer station to ensure the positional accuracy with which each wafer is carried from the wafer transfer apparatus to the wafer boat.

However, with such a cassette transfer apparatus, since the heat treatment reaction chamber at the final stage is of a vertical type, it is preferable for spatial reasons to have the cassette transfer apparatus also vertical to conform therewith. For this reason, the cassette chamber in the previous stage must be provided with a dead space of a suitable volume below the cassette transfer apparatus to allow the sequential raising of the cassette, to ensure that a large number of cassettes can be stacked. Therefore, the entire apparatus requires a large amount of space, and there is also a problem in that it becomes impossible to ensure that particles and other contaminants are completely prevented from entering the apparatus.

In other words, a conventional heat treatment reaction chamber has a configuration such that a wafer boat in a loading/unloading chamber in a lower portion thereof is raised or lowered by an arm of an elevator activated by the rotation of a ball screw, together with a heat insulating tube at the lower side thereof, and wafers transferred into a boat by the robot means of the wafer processing apparatus are subjected to prescribed processing by heaters within the main body of the heat treatment reaction chamber. During this time, the robot means is transferring wafers one or several at a time into the boat from a wafer cassette from the previous stage. This means that as group of wafers is being gradually raised while wafers are still being loaded into the boat, for instance in sequence from the top of the boat to the middle to the bottom, there will be differences in the amount of time that individual wafers reside in the heat treatment reaction chamber. As a result, wafers transferred into the upper, middle, and lower portions of the wafer boat will have different thermal histories, and thus there is the danger that this will have an effect on their optimal characteristics.

One method of counteracting this problem that has been experimented with is to insert the boat into the main part of the heat treatment reaction chamber after all of the wafers have been transferred by the robot means in sequence from the top of the boat to the bottom, to ensure that there is no unevenness in the thermal histories of the wafers. However, the heater used in the processing is frequently stopped, and thus the lifetimes of the heater and its control apparatus are reduced. The overall result is the disadvantage of an increase in costs. Another problem is caused by the uniform heating status will vary with time as the heater is stopped and started.

In a loading/unloading chamber where wafers are loaded and unloaded from the top of the boat to the bottom, it is inevitable that a large dead space is required at the bottom of the loading/unloading chamber because the robot means does not have the elevator function of moving through a distance equivalent to the pitch of the wafers. Therefore, it is inevitable that a large space is required within the unit plant to accommodate the height in the vertical direction of the vertical heat treatment apparatus.

SUMMARY OF THE INVENTION

An objective of the present invention is to solve the problems caused by the elevator stroke of the wafer boat into the heat treatment reaction chamber, based on conventional technology, ensure accurate transfer of wafers from wafer cassettes into the wafer boat by a transfer apparatus, and also ensure that the elevation of the wafer boat into the heat treatment reaction chamber is done through one full stroke with respect to all the wafers held in the wafer boat.

A further objective of the present invention is to provide a wafer processing apparatus wherein there is sufficient leeway in the height-wise direction of the elevator with respect to the boat, all the wafers have a uniform thermal history, and the heat treatment of the wafers is done smoothly and reliably.

To this end, in the wafer processing apparatus of the present invention where semiconductor wafers are subjected to a heat treatment such as CVD, diffusion, or oxidation, a prescribed number of wafers are contained in a prescribed number of wafer cassettes, a prescribed number of cassette chambers are provided around the periphery of a rotary turntable apparatus, and a prescribed number of wafer cassettes are set in each of the cassette chambers. In this case, a multiple-jointed wafer cassette conveyor apparatus transfers wafer cassettes through a gate and positions them at multiple stations provided around the periphery of the turntable. During this time, an inclination means at each station tilts the base surface of each cassette so that it is at a prescribed angle to the outward direction of the turntable, so that the centrifugal force generated by the rotation of the turntable is prevented from moving the cassettes out of position. Next, the pressure of the atmosphere within the housing of the turntable apparatus is reduced, the housing is filled with an inert gas such as nitrogen at normal pressure, and then the turntable is rotated in steps through a certain distance. The robot chamber, which has been evacuated, is then filled with inert gas at normal pressure, the base surface of each cassette in turn is repositioned until it is horizontal. The robot means then removes the wafers from the wafer cassette, the wafer boat is raised by the elevator means within the wafer transfer apparatus through a distance equivalent to the height of one cassette in the wafer loading/unloading chamber which has been reduced in pressure then filled with inert gas at normal pressure, and the wafers are transferred into the wafer boat. The boat is raised by the elevator of the loading/unloading chamber and the wafers are loaded as a batch into the heat treatment reaction chamber where they are subjected to a prescribed heat treatment. Since this makes the stroke through which the boat is raised equivalent to the movement through one cassette height of the robot means of the transfer apparatus, it is greatly reduced.

BRIEF DESCRIPTION OF THE DRAWINGS

FIG. 5 is a stylized side view of a mechanism of a wafer cassette conveyor apparatus of the wafer processing apparatus of the present invention.

FIG. 6 is a plan view illustrating the relationship between the wafer cassette conveyor apparatus and the turntable of the wafer processing apparatus of the present invention.

DETAILED DESCRIPTION OF THE PREFERRED EMBODIMENTS

An embodiment of the wafer processing apparatus of the present invention will be described below with reference to the accompanying figures.

Figure 1:
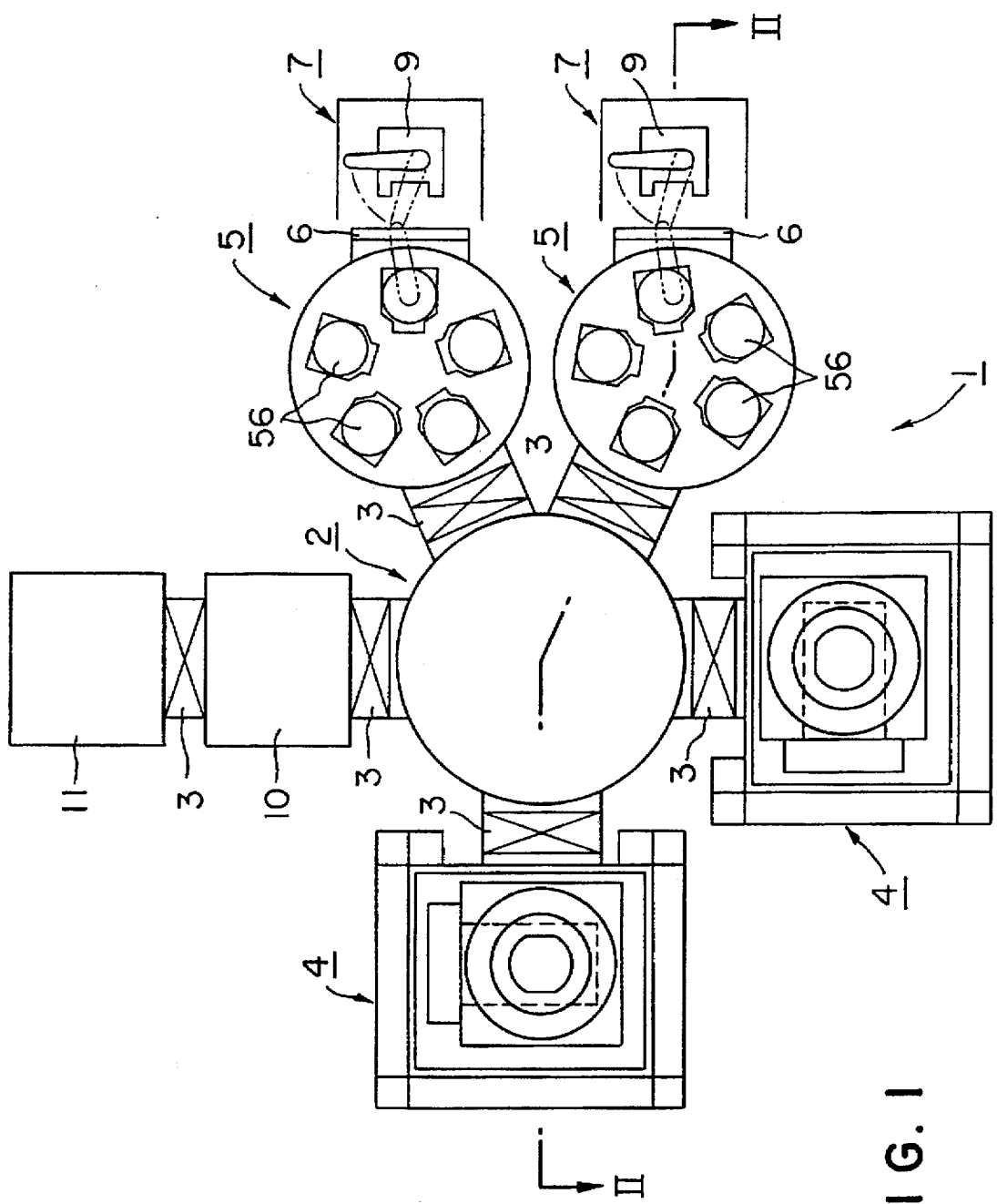
FIG. 1 is a abbreviated stylized plan view of one embodiment of the entire wafer processing apparatus of the present invention.
Figure 2:
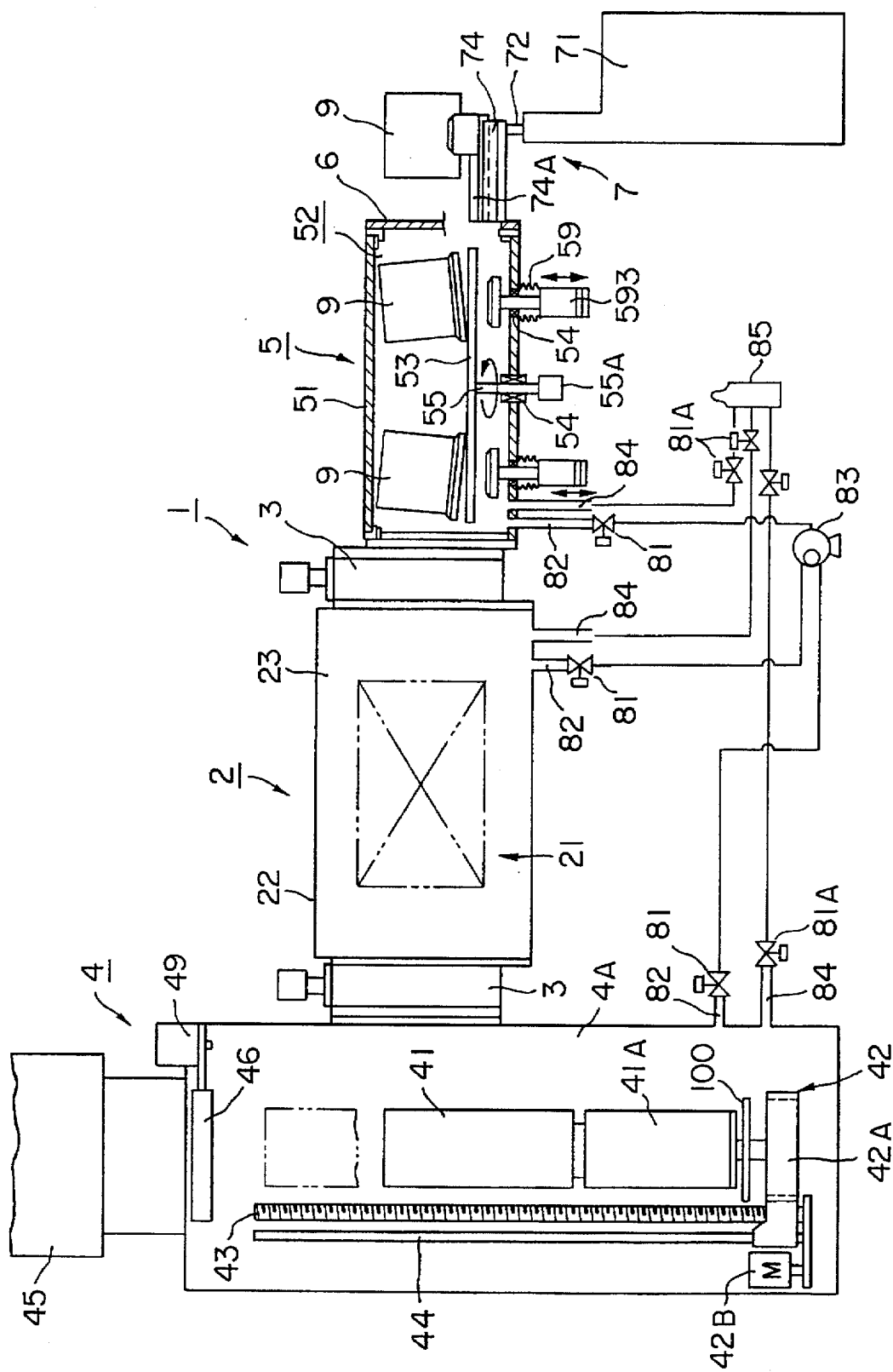
FIG. 2 is a stylized cross-sectional view of the embodiment of FIG. 1, taken along the line II—II in the direction of the arrows.

As shown in FIG. 1 and FIG. 2, a wafer processing apparatus 1 (such as one for 6" wafers) has a twin configuration centered on a wafer transfer apparatus 2, around the periphery thereof being provided twin vertical heat treatment reaction chambers 4 and turntable apparatuses 5 that are circular in section and function as loadlock chambers. A wafer cassette conveyor apparatus 7 is provided to correspond to each of the turntable apparatuses 5.

As shown in FIG. 1, a processing apparatus 11 (such as a surface processing apparatus) of the next stage is connected via a gate valve 3 to a pass chamber 10 that functions as a buffer.

Note that the various components of the wafer processing apparatus of the present invention are separated by electromagnetic gate valves 3 that enable the preservation of an airtight status therebetween when such components are evacuated to a prescribed low pressure or are filled with an inert gas such as nitrogen.

Note also that auxiliary electronic equipment such as control devices, computers, and operating panels are omitted from FIG. 1 for reasons of graphical clarity, but it should go without saying that of course the wafer processing apparatus of the present invention is provided therewith.

The various components of the wafer processing apparatus 1 of the present invention will now be described.

Figure 7:
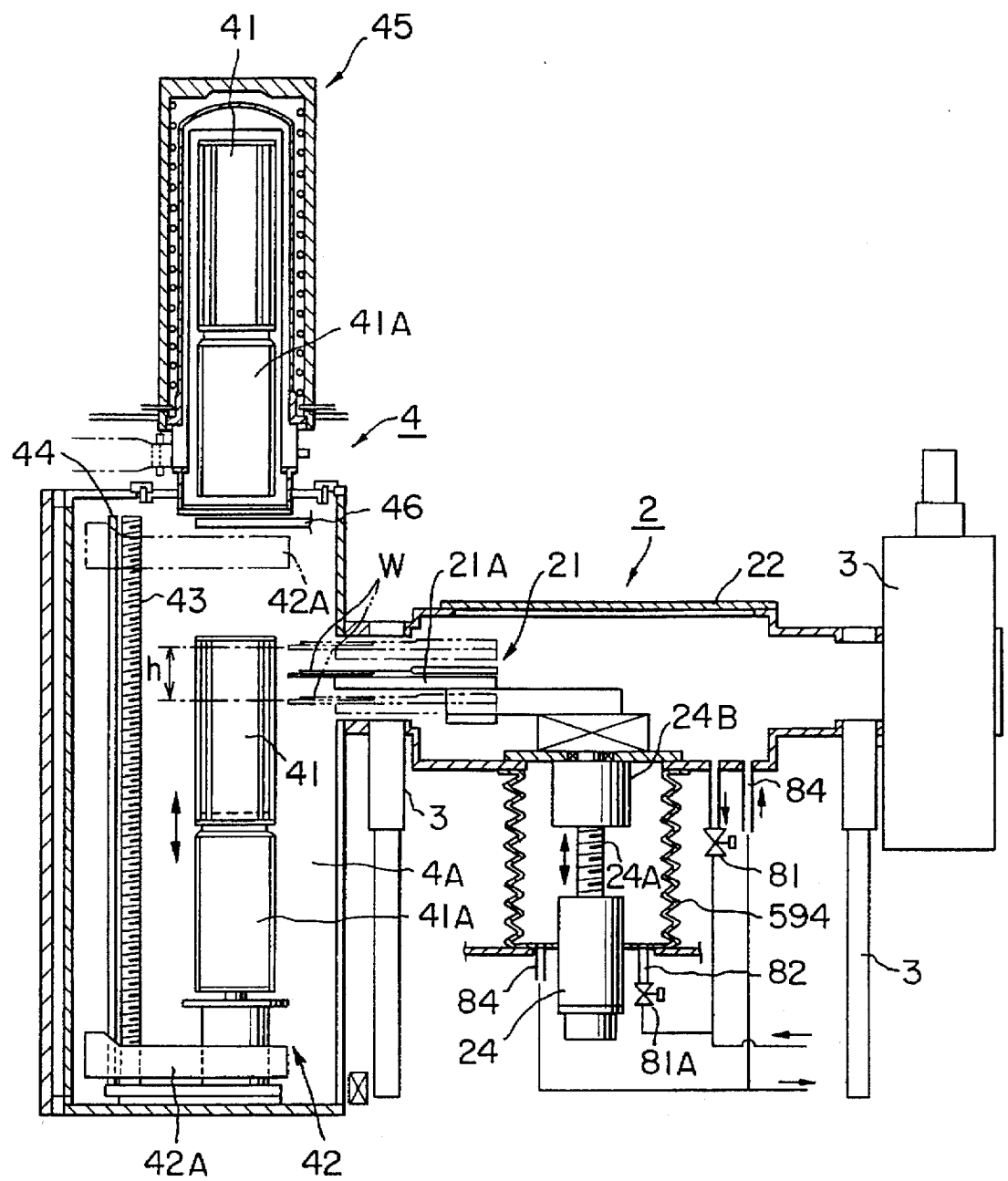
FIG. 7 is a vertical cross-sectional view of the relationship between the transfer apparatus and a heat treatment reaction chamber of the wafer processing apparatus of the present invention.

The wafer transfer apparatus 2 is provided with a robot means 21 that acts as a multiple-jointed transfer device, and the arrangement is such that a prescribed number of wafers W from a wafer cassette 9 carried on one of the turntable apparatuses 5 can be stacked thereby at a prescribed pitch in the height-wise direction in a wafer boat 41 of a wafer loading/unloading chamber 4A of the corresponding heat treatment reaction chamber 4, and also removed therefrom in a similar manner, as shown in FIG. 2 and FIG. 7. A vacuum pump 83 is connected by an electromagnetic valve 81 to an exhaust duct 82 provided at the base portion of a housing 22 of the wafer transfer apparatus 2.

A nitrogen gas cylinder 85 is also connected by an electromagnetic valve 81A to a nitrogen gas supply duct 84 for supplying inert gas.

As shown in FIG. 7, a drive apparatus 24 with an internal stepping motor is provided in the base portion of the housing 22 of the wafer transfer apparatus 2, with an airtight bellows 594 therebetween, and the rotation of a ball screw 24A raises the wafer cassette by one wafer height as each of the wafers W is transferred by the robot means 21 into the wafer boat 41. The full stroke h thereof is set to correspond to the height of one wafer cassette 9. An arm of the robot means 21 is designed to be able to move horizontally by means of a motor 24B. Note that FIG. 7 shows an idealized case in which only three wafers W are transferred into the wafer boat 41 by the robot means 21. Note also that the configuration of the drive apparatus 24 is such that it is connected electrically to a control apparatus which rotates the ball screw 24A in accordance with a previously input program to raise or lower the robot means 21 so that it can transfer the wafers W into the wafer boat 41. The wafer boat 41 is loaded into and removed from the main part 45 of the heat treatment reaction chamber by an elevator 42, and this arrangement ensures that all of the wafers W loaded in this manner are subjected to a uniform thermal history.

As shown in FIG. 2, each of the wafer loading/unloading chambers 4A below the corresponding heat treatment reaction chambers 4 and the lower-portion of each of housings 51 of the turntable apparatuses 5 is provided with an exhaust duct 82 connected by an electromagnetic valve 81 to the vacuum pump 83, and a nitrogen gas supply duct 84 connected to the nitrogen gas cylinder 85 by an electromagnetic valve 81A.

Within the wafer loading/unloading chamber 4A of each of the heat treatment reaction chambers 4, the wafer boat 41 is stood upright on an arm 42A of the elevator 42, with a heat-retention tube 41A therebetween. The arm 42A is engaged with a ball screw 43 that is rotated by a motor 42B, and is free to move up and down along a guide bar 44. The wafers W are then subjected to a prescribed thermal processing (such as CVD, diffusion, or oxidation) in the main part 45 of the heat treatment reaction chamber, above the wafer loading/unloading chamber 4A.

Figure 8:
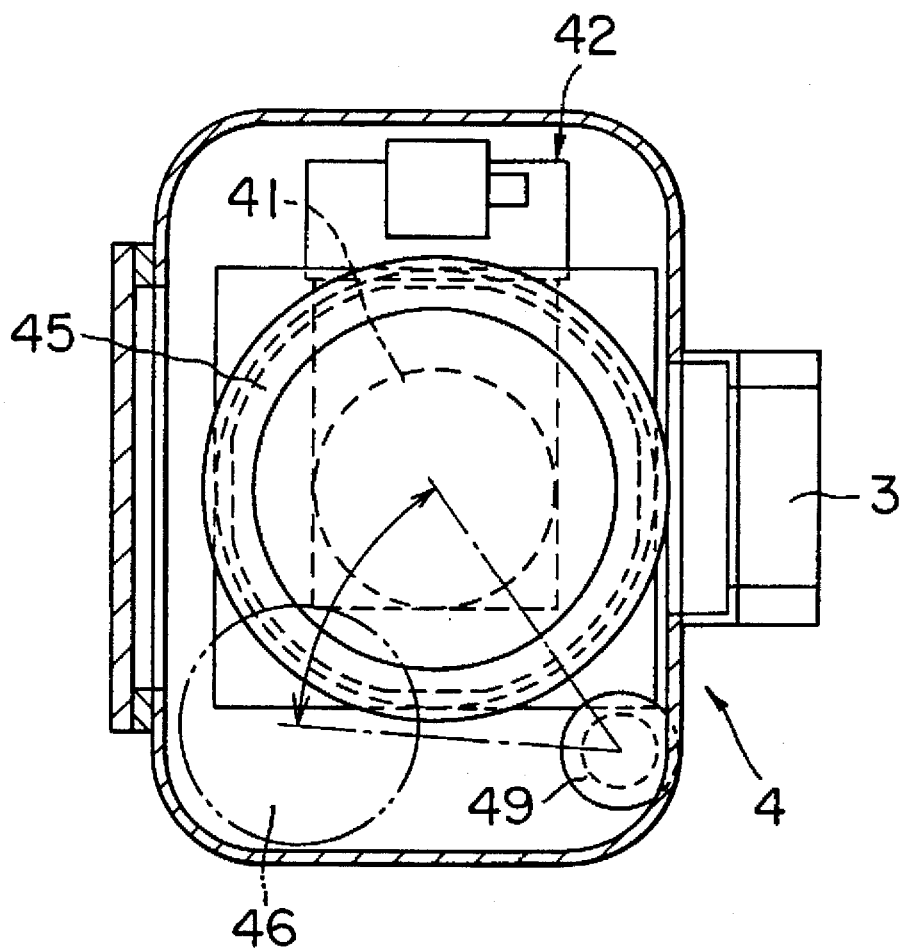
FIG. 8 is a horizontal cross-sectional view of a jack delivery portion of the heat treatment reaction chamber of the wafer processing apparatus of the present invention.

An opening at the lower end of the main part 45 of the heat treatment reaction chamber is, as shown in FIG. 8, provided with a shutter 46 that is moved by a swiveling drive apparatus 49 such as a rotary air cylinder after the wafer boat 41 has been loaded into the main part 45 of the heat treatment reaction chamber, to tightly seal the lower end opening of the main part 45 of the heat treatment reaction chamber and thus thermally isolate the wafer loading/ unloading chamber 4A from radiant heat.

The interior of a chamber 52 formed by the housing 51 of the turntable apparatus 5, which functions as a loadlock chamber, is, as shown in FIG. 2, provided with a turntable 53 set at the upper end of a shaft 55 penetrating through a base plate of the housing 51 with a magnetic fluid type of sealed bearing 54 therebetween. The lower end of the shaft 55 is linked to a stepping motor 55A, and the arrangement is such that the turntable 53 can be rotated incrementally through a prescribed pitch as directed by a control apparatus.

As shown in FIG. 1 and FIG. 6, a prescribed number (five in this embodiment) of stations 56 that function as carriers for holding wafer cassettes 9 are formed evenly spaced around the periphery of the turntable 53. These stations 56 also function as a buffer between the twin heat treatment reaction chambers 4 and the corresponding wafer transfer apparatuses 2, shown in FIG. 1.

Figure 3:
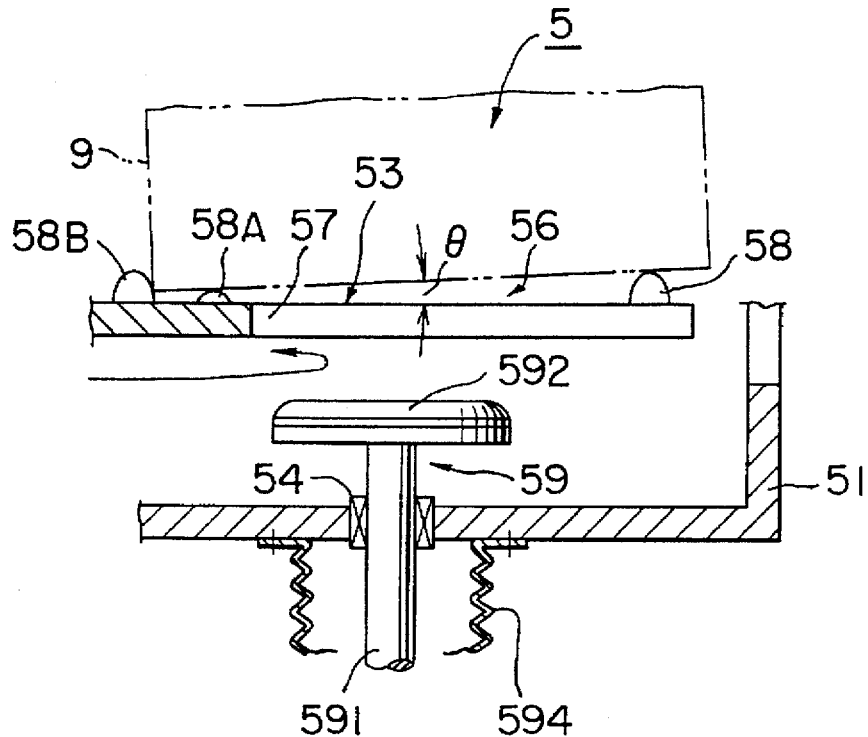
FIG. 3 is a partial expanded cross-sectional view of a wafer cassette transfer part of a turntable of the wafer processing apparatus of the present invention.

A rectangular notch 57 is cut into the turntable 53 at each of the stations 56 of the turntable apparatus 5, as shown in FIG. 6. Around each notch 57, a pair of protrusions 58 are formed near the peripheral edge of the upper surface of the turntable 53 and another pair of protrusions 58A of a lower height than the protrusions 58 are formed closer the center of the turntable 53. The wafer cassette 9 is conveyed and orientated from the wafer cassette conveyor apparatus 7, then it is set at the station 56 in such a manner as to face outward and be tilted at an angle θ so that its outer side is higher than the side thereof facing the center, as shown in FIG. 3. This prevents the wafer cassette 9 from slipping along the upper surface of the turntable 53, under the action of the centrifugal force acting upon it as the turntable 53 rotates, and thus makes sure that no offset occurs in the attitude of the cassette when it faces the wafer transfer apparatus 2.

In this way, the turntable apparatus 5 is arranged such that both the rotational attitude of the wafer cassette 9 from the wafer cassette conveyor apparatus 7 and the translational attitude thereof when it is transferred to the wafer transfer apparatus 2 are such that the wafer cassette 9 is maintained tilted upward at an angle θ with respect to the turntable 53, as shown in FIG. 3.

The turntable apparatus 5 is also provided with a cassette elevator apparatus 59 in the base surface of the housing 51 thereof, arranged such that a so-called H-surface of the base surface of the wafer cassette 9 is horizontal and its front and rear positions are determined while the wafer cassette 9 is being orientated and transferred. The cassette elevator apparatus 59 is provided with an elevating shaft 591 with a bearing 54 therearound. A main elevator apparatus body 592 formed at the top end of the shaft 591, with the top surface thereof being horizontal, passes through the corresponding notch 57 in the turntable 53, comes into contact with the H-Surface of the base surface of the wafer cassette 9, and raises the wafer cassette 9 above the level of the protrusions 58 and 58A, until the H-surface of the base surface of the wafer cassette 9 reaches a horizontal attitude, as shown by broken lines in FIG. 4. The lower end of the shaft 591 is linked to an air cylinder 593 for elevation, as shown in FIG. 2.

Figure 4:
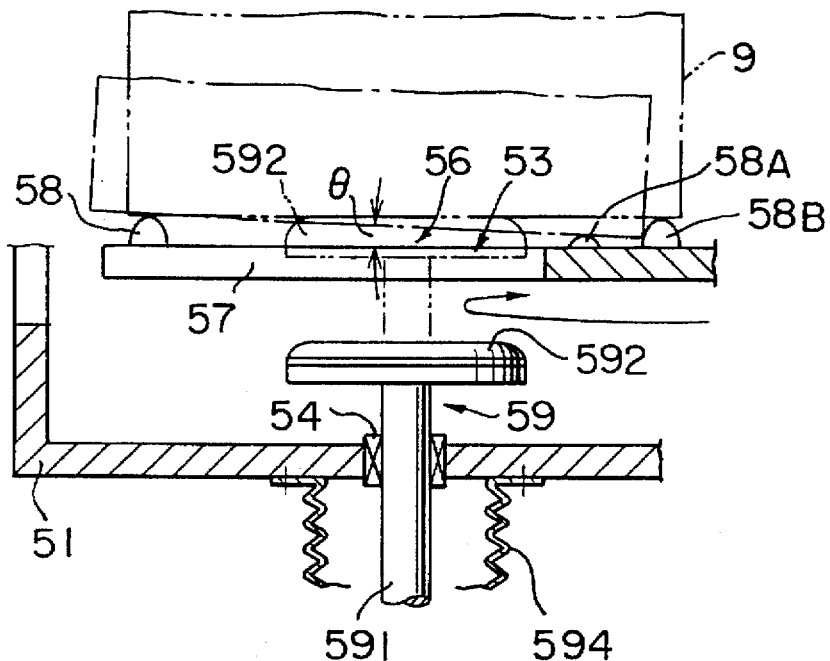
FIG. 4 is a partial expanded cross-sectional view of an equivalent portion of a wafer transfer apparatus of a turntable table of the wafer processing apparatus of the present invention.

Note that an airtight seal can be maintained between the air cylinder 593 and the lower surface of the housing 51 by the provision of an external bellows 594, as shown in FIG. 3 and FIG. 4.

The above configuration is duplicated in the same way as the side of the turntable apparatus facing the wafer transfer apparatus 2, so that the wafer cassette 9 is received by the turntable apparatus 5 and is transferred to and from the wafer cassette conveyor apparatus 7 and the wafer transfer apparatus 2 in such a manner that the H-surface of the base surface of the wafer cassette 9 is always in a horizontal attitude, as shown in FIG. 4.

As shown in FIG. 5 and FIG. 6, an arm 73 is threaded onto a ball screw 72 and is raised and lowered thereby through the rotation of a motor 71A in an elevator apparatus 71 of the wafer cassette conveyor apparatus 7. Multiple-jointed links 74 and 74A are connected to the arm 73, and a mounting plate 76 having protrusions 75 is provided at the far end thereof in such a manner that it always moves parallel with respect to the turntable apparatus 5. This arrangement ensures that the wafer cassette 9 is handed over smoothly from the cassette chamber to the turntable apparatus 5.

The operation of the wafer processing apparatus of the present invention will now be described.

First, when wafers W are to be subjected to a prescribed CVD, diffusion, or oxidation processing in the main part 45 of the heat treatment reaction chamber, wafer cassettes 9 are set in a stack in the cassette chamber, and each of the turntable apparatuses 5 are filled with their respective atmospheres by the operation of the gate valves 3, as directed by the control apparatus. The wafer transfer apparatus 2 and the heat treatment reaction chambers 4 are also prepared, then a wafer cassette 9 is placed on the mounting plate 76 of each wafer cassette conveyor apparatus 7.

The wafer cassette 9 is then moved by the wafer cassette conveyor apparatus 7 until the H-surface of the base surface thereof is facing the protrusions 58 and 58A of one of the notches 57 of the turntable 53 of the turntable apparatus 5, as shown in FIG. 6. The air cylinder 593 of the corresponding cassette elevator apparatus 59 of the turntable apparatus 5 extends the elevating shaft 591 thereof, as directed by the control apparatus, the main elevator apparatus body 592 (whose upper end is cut out to form a U-shape in cross-section) is raised thereby, and the wafer cassette 9 is raised even further thereby to an attitude such that it does not interfere with the mounting plate 76 of the wafer cassette conveyor apparatus 7. This brings the main elevator apparatus body 592 into contact with the H-surface of the base surface of the wafer cassette 9 in a horizontal attitude to enable a smooth hand-over such that the wafer cassette 9 is passed to the mounting plate 76 of the wafer cassette conveyor apparatus 7 with the H-surface of the base surface thereof in a horizontal attitude. At this point, the links 74 and 74A of the wafer cassette conveyor apparatus 7 swivel and contract out of the way, and also the ball screw 72 rotates to lower the assembly, to wait for the transfer of the next wafer cassette 9.

When the wafer cassette conveyor apparatus 7 swivels out of the way, the air cylinder 593 contracts as directed by the control apparatus, the main elevator apparatus body 592 is lowered by the shaft at the top end of which it is located, and the wafer cassette 9 is positioned such that the H-surface of the base surface thereof is brought gently into contact with the protrusions 58 and 58A and it is inclined at an attitude at an angle θ with the outward direction. (See FIG. 3.)

The stepping motor 55A shown in FIG. 2 is then rotated as directed by the control apparatus, which causes the shaft to rotate the turntable 53 through a prescribed angle to bring the next station 56 round to face the gate valve 3, and the next wafer cassette 9 is smoothly conveyed and orientated in the same manner by the wafer cassette conveyor apparatus 7. This sequence is repeated to convey and orientate all the wafer cassettes 9 in turn.

In this manner, the wafer cassettes 9 are sequentially conveyed, orientated, and positioned at the stations 56 of the turntable 53 of the turntable apparatus 5.

During this time, each wafer cassette 9 that is temporarily positioned at one of the stations 56 is held at an inclined attitude of an angle q to the outer direction on the protrusions 58 and 58A, and it is also controlled by stoppers 58B to ensure that it does not deviate from the above-described orientational attitude, even if it should slip outward under the effects of the centrifugal force generated as the turntable 53 rotates. Therefore, no particles are generated by relative frictional motion between the wafer cassette 9 and the turntable 53 as the turntable 53 rotates.

When wafer cassettes 9 have been positioned at all the stations 56 on the turntable 53 of the turntable apparatus 5 and the front door 6 is raised to completely seal the housing 51, then, the atmosphere in the chamber 52 of the turntable apparatus 5 is evacuated through the exhaust duct 82 by the vacuum pump 83 shown in FIG. 2. The electromagnetic valve 81 shuts off the exhaust duct 82 at a prescribed degree of vacuum, and at that point the electromagnetic valve 81A causes the chamber 52 to be filled with nitrogen gas from the nitrogen gas cylinder 85 through the nitrogen gas supply duct 84, until the chamber 52 is at normal pressure.

Note that, during this time, the housing 22, the heat treatment reaction chambers 4, and the wafer loading/unloading chambers 4A are already in a nitrogen atmosphere, and they are isolated from the outer atmosphere by all the gate valves 3.

As soon as wafer cassettes 9 have been transferred and orientated on all the stations 56 of the turntable apparatus 5, all the gate valves 3 are locked.

Since the rotational mechanical components such as the shaft 55 are provided with magnetic fluid sealed bearings 54, the sealed status can be maintained more reliably while the turntable apparatus 5 is rotating and the nitrogen gas is being introduced thereinto than with conventional apparatuses that move in a linear manner, so that nitrogen leakage is prevented during the rotation and no air leakage occurs. Therefore, the formation of oxide films due to the invasion of the outer atmosphere during the wafer processing, which is basically undesirable, is prevented.

Next, while the wafers W are being transferred by the robot means 21 from the wafer cassettes 9 into the wafer boat 41 in the wafer loading/unloading chamber 4A, these areas are placed at the same atmospheric pressure as the chamber 52 of the turntable apparatus 5 by reducing the pressure then filling them with nitrogen gas. After the gate valve 3 between the chamber 52 and the housing 22 and the gate valve 3 between the housing 22 and the wafer loading/unloading chamber 4A are opened, the robot means 21 of the wafer transfer apparatus 2 removes wafers W from the wafer cassettes 9 at the nearest station 56 on the turntable 53 of the turntable apparatus 5 and transfers them to the wafer boat 41.

During this time, as each of the stations 56 reaches the unloading position in the above sequence, the air cylinder 593 of the cassette elevator apparatus 59 extends, the main elevator apparatus body 592 at the top end of the shaft 55 passes through the notch 57 at each station 56, rises to support the H-surface of the base surface of the wafer cassette 9, then raises it further up off the protrusions 58 and 58A and the stoppers 58B until it is horizontal, as shown in FIG. 4. This ensures that the robot means 21 of the wafer transfer apparatus 2 can sequentially load the wafers W into the wafer boat 41, as will be described below, and the filled wafer boat 41 is then fitted into the main part 45 of the heat treatment reaction chamber by the elevator 42 to undergo the prescribed heat treatment. First, the robot means 21 of the wafer transfer apparatus 2 shown in FIG. 7 takes the wafer boat 41, which is at its lowermost position within the wafer loading/unloading chamber 4A of the heat treatment reaction chamber 4, and moves it to an initial setting at an uppermost position, and, at that position, the ball screw 24A is rotated by the drive apparatus 24 as directed by the control apparatus. This lowers the robot means 21 in steps of one pitch of the wafer spacing, so that the wafers W in the wafer cassette 9 can be transferred sequentially to the wafer boat 41. In this way, during this process, the robot means 21 lowers through a stroke h with respect to the wafer boat 41, so that it is able to transfer the wafers W one or several at a time from within the wafer cassette 9 to the wafer boat 41, without the wafer boat 41 moving down. Wafers W corresponding to the stroke h with respect to the wafer boat 41 (in other words, the height of one wafer cassette 9) are transferred. The design of the apparatus is such that, at this point, the top of the wafer boat 41 does not reach the level of the shutter 46 as the wafers W are being transferred, as shown in FIG. 7, and there is plenty of leeway remaining.

Therefore, as described above, the drive apparatus 24 of the robot means 21 of the wafer transport apparatus 2 is arranged in such a manner that the wafer transport apparatus 2 is elevated as appropriate through a stroke h equivalent to the height of one wafer cassette 9. This enables more leeway in the timing at which the wafer boat 41 is introduced into the main part 45 of the heat treatment reaction chamber 4. In other words, since there is some leeway in the stroke through which the wafer boat 41 is elevated in the wafer loading/unloading chamber 4A, there is effectively no variation in the thermal histories of the wafers transferred into the top portion of the wafer boat 41.

When the robot means 21 reaches the end of the stroke h equivalent to the height of one wafer cassette 9, the boat 41 is lowered through a stroke equivalent to one wafer height until it is fully loaded, the shutter 46 is opened, and the wafer boat 41 is loaded into the main part 45 of the heat treatment reaction chamber 4.

In this case, there is plenty of leeway in the elevator stroke which is only a stroke h equivalent to the height of one wafer cassette 9, even if design variations should dictate that the stroke of the robot means 21 as it moves through the stroke h equivalent to the height of one wafer cassette 9 does not start from the top of the wafer boat 41 but starts from the bottom thereof. This means that variations in the thermal histories of the wafers W transferred into the uppermost part of the wafer boat 41 can be reduced, and thus imbalances in the thermal histories of all the wafers loaded into the wafer boat 41 can be minimized.

In this manner, the relative movement between the wafer boat 41 and the robot means 21 is only the stroke h equivalent to the height of one wafer cassette 9 during the above-described loading of the wafers W into the wafer boat 41. In the subsequent processing, the wafer boat 41 is raised through a pitch equivalent to one wafer height, the wafer boat 41 is inserted into the main part 45 of the heat treatment reaction chamber 4, and at the stroke end the shutter 46 seals off the lower portion of the main part 45 of the heat treatment reaction chamber 4 and the prescribed heat treatment is performed.

During this time, the two turntable apparatuses 5 act as buffers for the two heat treatment reaction chambers 4.

Once the prescribed heat treatment has been performed on the wafers W in each of the heat treatment reaction chambers 4, the above-described process is reversed to transfer the treated wafers to the next stage in the processing.

Note that the invention described in this application is not limited to the embodiment described herein. For example, the present invention can be used in various situations as appropriate on any wafers to be treated, not just semiconductor wafers.

What is claimed is:

1. A wafer processing apparatus for transferring wafers from a wafer cassette to a wafer boat, said apparatus comprising:

means defining a wafer loading/unloading chamber adapted to receive a wafer boat, a heat-treatment furnace, a first elevator means for moving and supporting a wafer boat within said loading/unloading chamber, said first elevator means being mounted to a floor of said wafer loading/unloading chamber, for vertically moving the wafer boat into and out of said vertical heat treatment furnace, means defining a transfer housing, gate valve means connecting said loading/unloading chamber and said transfer housing, said gate valve means selectively airtightly isolating said loading/unloading chamber and said transfer housing, and a wafer transfer apparatus located within said transfer housing, said wafer transfer apparatus including a transfer means for transferring wafers from a location in a wafer cassette to the wafer boat on said first elevator means, and a second elevator means for reciprocally vertically moving said transfer means with respect to the wafer boat, said reciprocal vertical movement of said second elevator means defining a stroke with respect to the boat that is equivalent to a height of the wafer cassette.

2. The wafer processing apparatus of claim 1, wherein said transfer means of said wafer transfer apparatus is a robot means having an arm capable of swiveling in a horizontal plane.

3. The wafer processing apparatus of claim 1, wherein said apparatus further comprises a swivelable shutter located proximate to an opening of said vertical heat treatment furnace and swivel drive means for selectively driving said shutter to open and close said furnace opening, and wherein said first elevator means has a lower position such that when said first elevator means is in such lower position, an uppermost portion of the wafer boat is spaced apart from said furnace opening and said shutter, below said opening and said shutter.

* * * * *